United States Patent [19]

Kumagai

[11] 4,336,534
[45] Jun. 22, 1982

[54] CONTROL GENERATOR FOR USE IN BROADCAST RECEIVER INCLUDING IMPROVED SIGNAL LEVEL INDICATOR

[75] Inventor: Morio Kumagai, Tokyo, Japan

[73] Assignee: Trio Kabushiki Kaisha, Tokyo, Japan

[21] Appl. No.: 53,714

[22] Filed: Jul. 2, 1979

[30] Foreign Application Priority Data

Jul. 17, 1978 [JP] Japan .................................. 53-86966
Jul. 17, 1978 [JP] Japan ............................. 53-98241[U]

[51] Int. Cl.² ............................................. G09G 3/00
[52] U.S. Cl. .................................... 340/753; 340/715; 340/789
[58] Field of Search ............... 455/154, 159, 164, 182, 455/194, 192, 173, 174, 197; 340/752, 753, 761, 754, 715, 789; 324/96, 122

[56] References Cited

U.S. PATENT DOCUMENTS

| | | | |
|---|---|---|---|
| 3,795,863 | 3/1974 | Umeda et al. ........................ | 340/753 |
| 3,914,758 | 10/1975 | Ingle .................................... | 340/753 |
| 3,924,078 | 12/1975 | Bussey ................................. | 340/715 |
| 3,969,672 | 7/1976 | Wallander et al. .................. | 340/753 |
| 4,039,956 | 8/1977 | Shimanek et al. .................. | 340/753 |

Primary Examiner—Marshall M. Curtis
Attorney, Agent, or Firm—Gerald J. Ferguson, Jr.; Joseph J. Baker

[57] ABSTRACT

A control signal generator for use with a broadcast receiver having a signal level indicator including a plurality of sequentially actuated luminous elements. The received signal strength is indicated by the number of luminous elements which are lit. The control signal generator is responsive to the signal level indicator to provide control signals for automatic frequency control circuitry and/or muting circuitry. The signal level indicator may include cicuitry for converting arbitrarily selected changes in the received signal to changes the indicator normally detects to thereby effect the sequential actuation of the luminous elements in accordance with the arbitrarily selected changes in the received signal.

13 Claims, 6 Drawing Figures

CONTROL GENERATOR FOR USE IN BROADCAST RECEIVER INCLUDING IMPROVED SIGNAL LEVEL INDICATOR

BACKGROUND AND OBJECTS OF THE INVENTION

This invention relates to a control signal generator circuit that controls the muting action and/or automatic frequency control action of a broadcast receiver such as an AM or FM receiver and to improved signal level indicators for use with such receivers.

In receivers of the above type, light-emitting indicators may be employed which indicate the level or strength of the received input signal. These indicators may comprise an integrated circuit, which may be called an LED array driver. The indicators typically include a reference voltage network and a plurality of comparators which sequentially light luminous elements such as LED's or lamps which are connected to the output terminals of the comparators. Thus, an additional luminous element is lighted with each predetermined increase in the receiver input signal. Typically, the light-emitting indicator is actuated by rectifying the intermediate frequency signal output (before amplitude limiting, if any) and applying the rectified output to the light-emitting indicator in order to sequentially light the luminous elements and thus indicate the receiver input level with a signal level indicator (the light-emitting indicator) instead of a signal level meter comprising a conventional analog meter.

Accordingly, it is a first object of this invention to provide a control signal generator circuit that controls automatic frequency control (AFC) action and/or muting action, for example, by using the light-emitting indicator employed as the signal level indicator in a broadcast receiver It is a further object to light the luminous elements of the light-emitting indicator after controlling and stabilizing the AFC action and/or muting action with the control signals of the above control signal generator circuit.

Light-emitting indicators which have been heretofore available sequentially light the luminous elements at fixed input voltage steps of typically 200 mV. Further, some available indicators sequentially light the luminous elements over a predetermined fixed range of the input voltage.

Accordingly, it is a further object of this invention to provide a light-emitting indicator that can sequentially light the luminous elements over a variable input voltage range at variable steps with the variable range.

Other objects and advantages of this invention will be apparent from a reading of the following specification and claims taken with the drawing.

DETAILED DESCRIPTION OF PREFERRED EMBODIMENTS OF THE INVENTION

Figure 1:
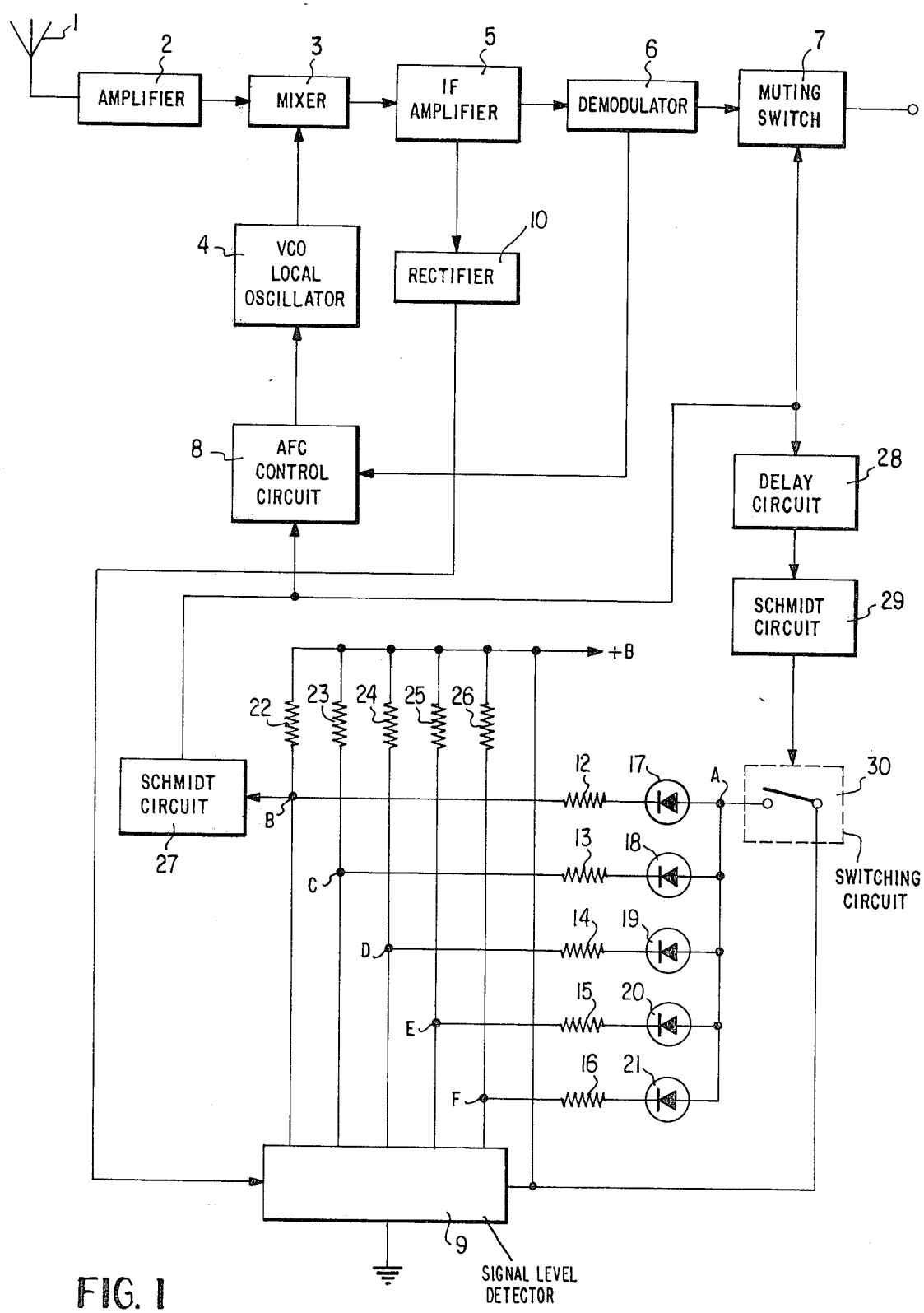
FIG. 1 is a block diagram of a broadcast receiver using an illustrative embodiment of a control signal generator circuit in accordance with this invention.

Reference should be made to the drawing where like reference numerals refer to like parts.

FIG. 1 is a block diagram of a broadcast receiver using a control signal generator circuit in accordance with one illustrative embodiment of this invention. In FIG. 1, 1 is an antenna, 2 is a high frequency amplifier, 3 is a mixer, 4 is a local oscillator comprising a voltage control oscillator, 5 is an intermediate frequency amplifier, 6 is a demodulator, 7 is a muting switch, and 8 is an AFC control circuit. The foregoing components together comprise the broadcast receiver.

9 is a signal level detector that sequentially lights luminous elements connected to the output terminals thereof with each predetermined increase in the input voltage applied thereto. The output voltage of intermediate frequency amplifier 5 is rectified before amplitude limiting, if any, by a rectifier circuit 10 and inputted to signal level detector 9. The output terminals B, C, D, E, and F of signal level detector 9 are respectively connected to resistor 12 and LED 17, resistor 13 and LED 18, resistor 14 and LED 19, resistor 15 and LED 20, and resistor 16 and LED 21. The anodes of LED's 17, 18, 19, 20, and 21 are connected in common and the output terminals B, C, D, E, and F are connected to the power supply +B through respective resistors 22, 23, 24, 25, and 26. When none of LED's 17 through 21 are lighted, the voltage of output terminals B through F is maintained at the approximate voltage of the power supply +B. As the input voltage to signal level detector 9 increases, LED's 17, 18, 19, 20, and 21 are lit in the foregoing order.

When the voltage from one of the output terminals B through F, the output terminal B in this embodiment, is applied to Schmidt circuit 27 the output of the Schmidt circuit is used as a control signal for AFC control circuit 8 and muting switch 7. At the same time, it is also applied to a Schmidt circuit 29 via a delay circuit 28. A switching circuit 30 is switched by the output of Schmidt circuit 29 to connect the voltage from the power supply +B to the common connection point A of the anodes of LED's 17 through 21.

AFC control circuit 8 effects AFC control action when low level control signals are outputted by Schmidt circuit 27 while the output signals of demodulator 6 to the local oscillator are cut-off by high level control signals from the Schmidt circuit to stop the AFC action. Muting switch 7 effects muting action when the high level control signal from Schmidt circuit 27 is applied thereto, the muting action being inhibited by low level control signals. The delay effected by delay circuit 28 extends from the time the control signal from Schmidt circuit 27 is applied to AFC control circuit 8 and muting switch 7 to the time the AFC and muting actions stop and stabilize. Switching circuit 30 causes the voltage of the power supply +B to be applied to the common connection point A in response to a low level input from Schmidt circuit 29. Resistors 12 through 16 are current limiting resistors for LED's 17 through 21. Schmidt circuit 29 is for waveform rectification and may be omitted.

In operation, when the input signal from antenna 1 is small, the input voltage to signal level detector 9 (which is the rectified output of the intermediate frequency amplifying circuit 5) is small and LED's 17 through 21 do not light. Thus, the voltage at output terminal B is the voltage of the power supply +B. Accordingly, the output of Schmidt circuit 27 is at a high level so that AFC control circuit 8 is inhibited and muting switch 7 performs its muting action.

As the input signals from antenna 1 increase, the input voltage to signal level detector 9 increases to the input voltage that lights the first-lighting LED 17, the voltage of output terminal B becomes almost zero volts, the output of Schmidt circuit 27 becomes a low level output, AFC control circuit 8 is actuated to effect the AFC action and muting switch 7 is actuated to stop the muting action. Further, the output of Schmidt circuit 27 applied to Schmidt circuit 29 and switching circuit 30 via delay circuit 28 causes the voltage of the power supply +B to be impressed on common connection point A. Consequently, LED 17 is lighted, the AFC action is in operation, the muting action is stopped, and the fact that the signal level has reached a level sufficient to light LED 17 is indicated.

And, when the input signals from antenna 1 further increase, the input voltage to signal level detector 9 also further increases until the signal level reaches a level sufficient for lighting LED 18. In a similar manner, further increases in the input voltage to the signal level detector 9 sequentially light LED's 19, 20, and 21.

In the above illustration, the input voltage for Schmidt circuit 27 was obtained from output terminal B. When it is obtained from output terminal C, for example, the action is the same as above. However, in this case, when the input signals from antenna 1 increase and the input voltage to signal level detector 9 reaches the input voltage sufficient to light LED 17, the voltage of the power supply +B is not impressed on the common connection point A even though the output voltage at terminal B becomes zero volts. Consequently, LED 17 does not light, AFC action is not effected, and the muting action is not inhibited. As the input voltage of signal level detector 9 increases and reaches the voltage that lights LED 18, the voltage of the output terminal C becomes zero volts and the output of Schmidt circuit 27 is switched to its low level. Then, as in the case when the input of the Schmidt circuit was obtained from output terminal B, AFC action is effected and muting action stopped due to the lowered level of the output of Schmidt circuit 27. Further, the output of Schmidt circuit 29 drops to a low level delayed by the time required for the foregoing actions to be completed. The voltage of the power supply +B is then impressed on common connection point A by switching circuit 30 and LED's 17 and 18 are lighted. Furthermore, as the input voltage to signal level detector 9 increases, LED's 19, 20, and 21 are sequentially lighted.

Therefore, by obtaining the input voltage of the Schmidt circuit 27 from any of the output terminals B, C, D, E, or F, the AFC and muting actions can be controlled to operational or non-operational states and after these actions are stabilized, an LED can be lighted according to the input level at antenna 1. Also, the control level that switches the AFC action and muting action to the operational or non-operational states can be used to switch in only a predetermined number of LED's. Further, this may be easily done. For example, a multi-pole, change-over switch (not shown) may be connected between the respective output terminals B, C, D, C, and F of the signal level detector 9 and the input of Schmidt circuit 27 to easily effect the input level at which the AFC is initiated and the muting action inhibited.

When a fixed input level is used as a control level to inhibit the muting action and initiate the AFC, it may be done by connecting a resistor only between the output terminal of signal level detector 9 corresponding to the fixed input level and the power supply +B. For example, if the fixed control level corresponds to LED 18, resistors 22 and 24 through 26 are unnecessary and may be removed so that only resistor 23 is present.

In the case of an FM receiver, the S-curve output of demodulator circuit 6 may be inverted on the (−) side of the S-curve output by using, for example, an absolute value amplifier, sampled at a fixed level and applied to an AND gate together with the output of Schmidt circuit 27 and used as a control signal for AFC and muting actions. In this case, the range of action for AFC and muting actions is narrowed. In the above description, LED's were used as the luminous elements although such elements such as lighting electric bulbs may also be used.

As explained above, the light-emitting indicator can be used for both generating control signals and indicating signal levels in accordance with the present invention, thus simplifying circuit construction. In addition, lighting of the luminous elements is possible after the actions of the AFC circuit and the muting switch are stabilized. Further, level switching of the control signals is also simple and it is possible to switch the level with the number of luminous elements used.

Figure 2:
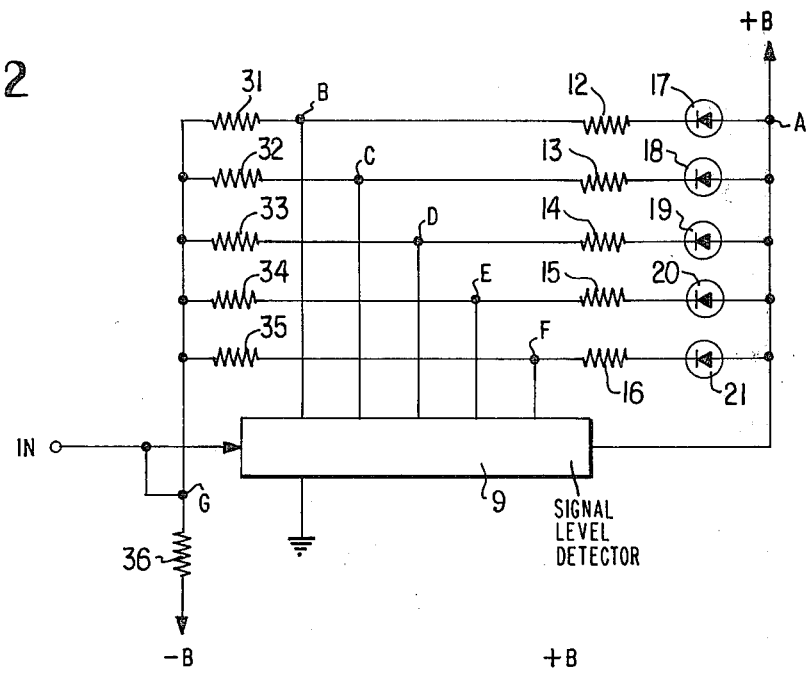
FIG. 2 is a circuit diagram of an illustrative light-emitting indicator in accordance with this invention.

FIG. 2 is a circuit diagram of an illustrative light-emitting indicator in accordance with the present invention. In FIG. 2, 9 is the signal level detector where the LED's are sequentially lit at each fixed level increase of input voltage. Resistors 31–35 are respectively connected to output terminals B–F, the other ends of the resistors being connected in common to the input terminal IN. A resistor 36 is connected between the common connection point G and the power supply −B. As stated above, resistors 12–16 are for limiting the current to LED's 17–21. Since their resistances are small, they are ignored in the following explanation.

Figure 3:
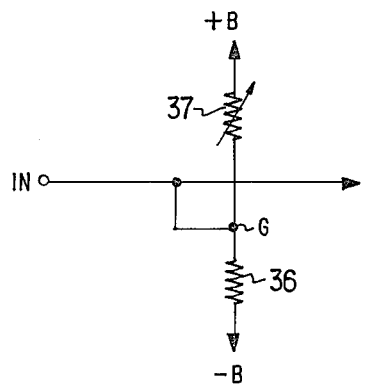
FIG. 3 is a circuit diagram of an equivalent circuit which illustrates the action of the light-emitting indicator of FIG. 2.

Suppose none of the LED's 17–21 are lit. That is, when there is no input voltage applied to the input terminal IN or when the input voltage is insufficient to light the first-lighting LED 17, the voltage at output terminals B–F is approximately the same as the voltage of the power supply +B. In this case, looking from the input terminal IN, if the combined parallel resistance of resistors 31–35 is denoted as 37, the equivalent circuit is as shown in FIG. 3. Next, when LED 17, which lighs first when an input voltage is impressed, is lit, the potential of output terminal B becomes almost zero. Thus, the value of resistor 37 is effectively changed. In other words, the parallel resistance value of resistors 31–35 appears as an increased resistance value of resistor 37 because of the grounding of terminal B of resistor 31 and the voltage at common connection point G drops.

As the input voltage increases thus sequentially lighting LED's 18–21, the voltage at common connection point G sequentially drops as the LED's are lighted. Consequently, if the input voltage impressed on the input terminal IN does not increase in accordance with the voltage drop at common connection point G, the LED to be lighted next is not lit. Therefore, by proper selection of the resistance values of resistors 31–35, the lighting level for each LED can be set at any value of the input voltage applied to input terminal IN. Further, each LED can be lit within any range of input voltage or at any voltage levels with the range. In other words, the arbitrarily selected levels of the input voltage applied to input terminal IN can be converted to levels that match the rating of signal level detector 9—that is, the input voltage levels at which detector 9 normally sequentially actuates LED's 17–21.

In addition, when the voltage of common connection point G is set at zero, the LED 17 to be lighted first can be lit at the minimum rated lighting level of the signal level detector 9 (that is, the level at which detector 9 normally lights LED 17). Further, when the voltage at G is set at the negative side, the lighting of LED 17 is effected by an input voltage (at IN) greater than the rated minimum lighting level.

Figure 4:
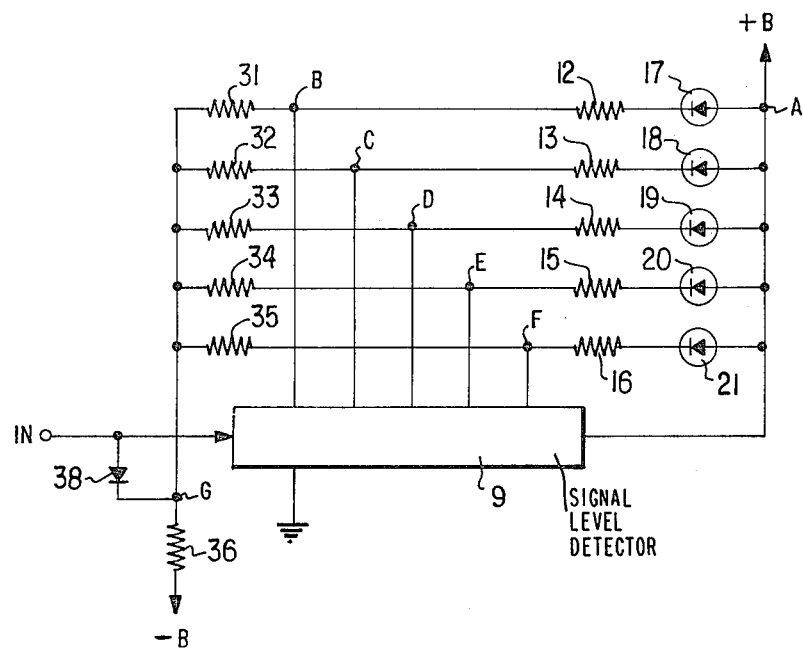
FIGS. 4 and 5 are circuit diagrams of other illustrative light-emitting indicators in accordance with this invention.

FIG. 4 is a circuit diagram of another embodiment of this invention where a diode 38 is connected between common connection point G and input terminal IN. If the voltage at common connection point G is set at a slightly positive value and the input voltage is zero, the lighting of LED 17 can be effected accurately with an input voltage equal to the minimum rated lighting level of signal level detector 9 due to diode 38.

Figure 5:
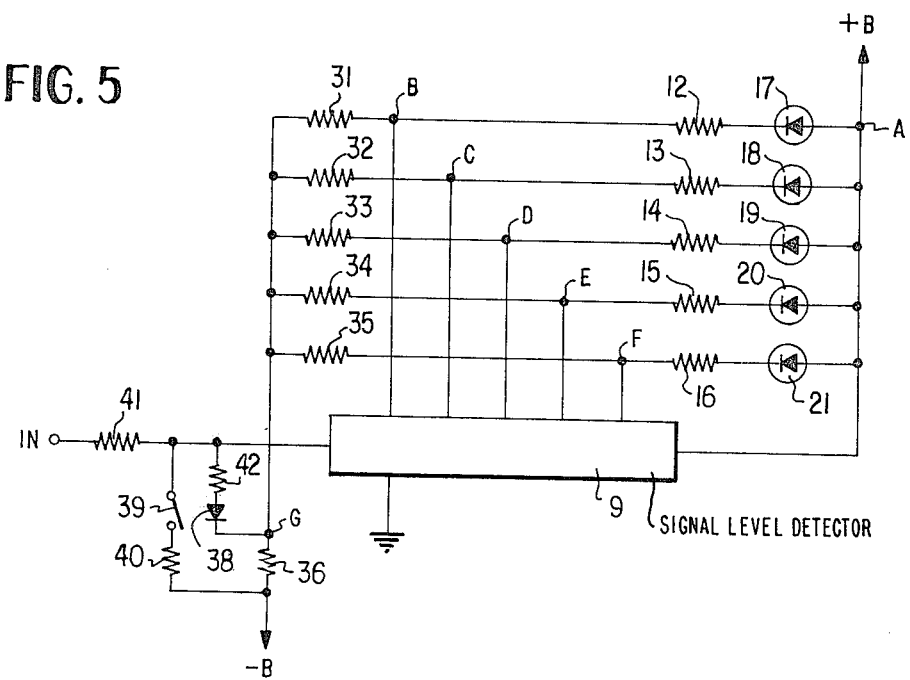

FIG. 5 is a circuit diagram of yet another embodiment of the invention where a switch 39 and resistors 40–42 are added. Switch 39 is for switching the input voltage range of the signal level detector. For example, it may be interlocked with an AM-FM change-over siwtch in an AM-FM receiver so that the detector can indicate both field strengths of 2 V–5 V for AM and 200 mV–5 V for FM. In other words, if resistors 31–35 and 40–42 are properly set, the indication of FM field strength when the switch 20 is off (and AM field strength when it is on), can be effected respectively.

As explained above, the light-emitting indicator of this invention lights luminous elements sequentially in response to changes in input voltage where the sequential lighting of the luminous elements can be effected within any range of input voltage or at voltage levels with any intervals therebetween because of a converter provided to convert arbitrarily selected levels of the input voltage to input levels which match the rating of indicator 9. Further, even when the changes in the input voltage are irregular, the luminous element to be lighted next can be set so that it emits light after complete lighting of the luminous element that lights before it. Or, even when the changes in the input voltage are non-linear, the lighting intervals of the luminous elements can be changed to near linear. Also when the light-emitting indicator of this invention is used as a signal strength indicator in an AM-FM receiver, even when the changing range of the input voltage is varied between AM and FM switching, it can be easily adapted to the receiving mode selected.

Figure 6:
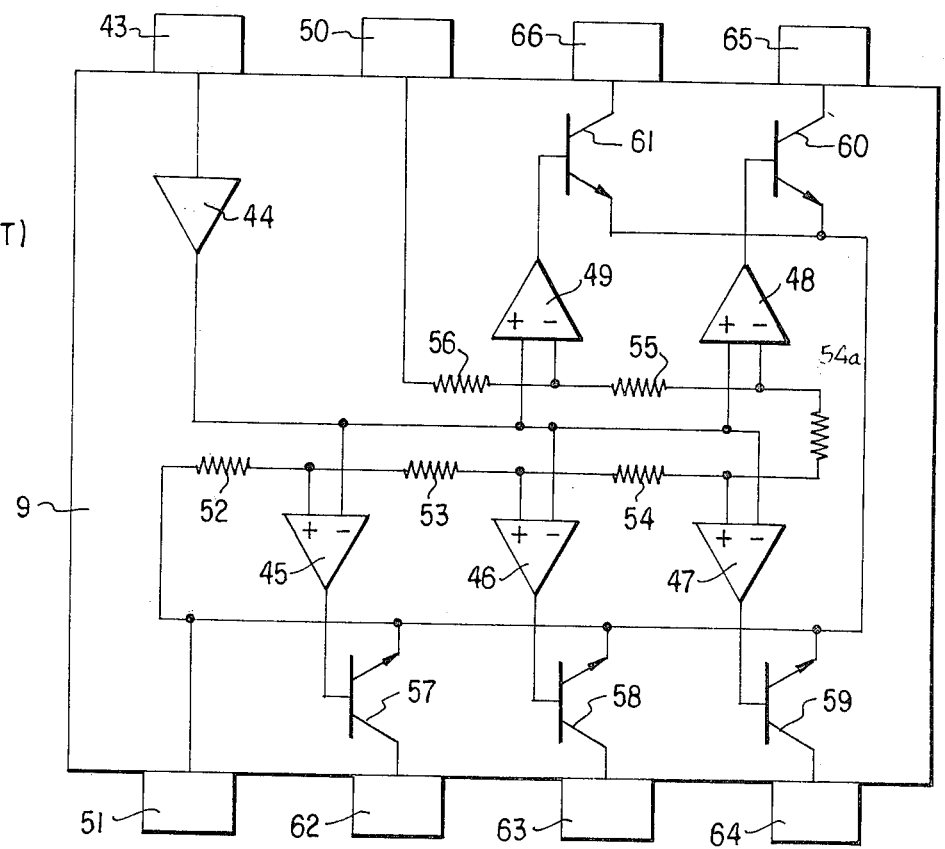
FIG. 6 is a plan view of an illustrative dual-in-line package containing a prior art signal level detector.

Referring to FIG. 6, there is illustrated in plan view a typical dual-in-line integrated circuit package containing a prior art signal level detector such as that sold by Texas Instruments Incorporated under the type designation SN16889P. The input pin 43 may be connected to the terminal IN of FIGS. 2–5. An amplifier 44 connects pin 43 to the inverting inputs of comparators 45–49. The pin 50 is connected to the +B power supply while pin 51 is connected to ground. A reference voltage network comprising resistors 52–56 is connected between pins 50 and 51, the resistors also being connected to the non-inverting inputs of the comparators. The comparator outputs are respectively connected to output transistors 57–61, the collectors of which are respectively connected to output pins 62–66 where the latter pins correspond to output terminals B–F.

In operation, detector 9 of FIG. 6 digitizes analog input signals by detecting the level of the input signal. Terminal B is switched to a logic low level at a typical input voltage of 200 mV. After each 200 mV step, the subsequent terminals are also switched to a logic low level thereby effecting the sequential lighting of LED's 17–21. Thus, terminals B–F are all switched to a logic low level at a typical input voltage of 1,000 mV. Although it would be possible to vary the input voltage range and the levels within the range to which the LED's 17–21 light by varying the values of resistors 52–56 and/or the voltage applied to pin 50, this is not practical due to the integrated circuit nature of indicator 9. Hence, as discussed hereinbefore, these parameters in addition to other parameters associated with indicator 9 can be readily changed in accordance with the present invention as discussed hereinbefore with respect to FIGS. 2–5.

What is claimed is:

1. In a light-emitting level indicator which includes a signal level detector which sequentially provides a plurality of output signals at a respective plurality of output terminals thereof to thereby sequentially light luminous elements respectively connected to said output terminals in response to predetermined changes in the input signal applied to an input terminal of the signal level detector so that the number of lit luminous elements indicates the magnitude of the input signal, the improvement of converter means for converting arbitrarily selected changes in said input voltage to said predetermined changes where said arbitrarily selected changes are different from said predetermined changes so that said plurality of luminous elements can be sequentially lit in accordance with the arbitrarily selected changes in the input voltage where said converter means comprises only passive elements including (a) a plurality of impedance means respectively connected to the output terminals of said signal level detector, the opposite terminals of said impedance means being connected to a common connection point, (b) a further impedance means connected between said common connection point and a fixed predetermined voltage and (c) means for connecting said common connection point to the said input terminal of the signal level detector.

2. The improvement as in claim 1 including means for switching the range of input signals over which said signal level detector operates from a first range to a second range.

3. The improvement as in claim 1 where said signal level detector includes a plurality of comparator means and a reference voltage means connected between first and second predetermined voltages for providing a plurality of different reference voltages to respective first inputs of said plurality of comparators, said input signal to the signal level detector being applied to second inputs of said plurality of comparators and said output terminals of the signal level detector being responsive to the outputs of the comparators.

4. The improvement as in claims 3 where the voltage at said common connection point when said input voltage is not present is equal to said second predetermined voltage.

5. The improvement as in claims 3 where the voltage at said common connection point when said input voltage is not present is different than said second predetermined voltage.

6. The improvement as in claim 4 where said first predetermined voltage is the +B power supply for the signal level detector, the second predetermined voltage is ground and the fixed predetermined voltage is the −B power supply for the signal level detector.

7. The improvement as in claims 1 or 3 where said signal level detector is a integrated circuit.

8. The improvement as in claim 1 including reference voltage means for providing a predetermined reference voltage to the signal level detector where said output signals of the signal level detector sequentially switch substantially between the predetermined reference voltage and a further predetermined voltage in response to said predetermined changes in the input signal.

9. The improvement as in claims 1, 3 or 8 where said connecting means between the input terminal and the common connection point includes rectifying means.

10. The improvement as in claims 1, 3 or 8 where said connecting means directly connects said common connection point to said input terminal.

11. The improvement as in claims 1, 3 or 8 including a second further impedance means and a switching means connected between said fixed predetermined voltage and the input terminal.

12. The improvement as in claim 8 where said further predetermined voltage is substantially ground.

13. The improvement as in claim 5 where said first predetermined voltage is the +B power supply for the signal level detector, the second predetermined voltage is ground and the fixed predetermined voltage is the −B power supply for the signal level detector.

* * * * *